United States Patent
Chen et al.

(10) Patent No.: US 7,300,812 B2
(45) Date of Patent: Nov. 27, 2007

(54) MICRO ELECTRICAL MECHANICAL SYSTEM

(75) Inventors: Chien-Hua Chen, Corvallis, OR (US); David M. Craig, Albany, OR (US); Charles C. Haluzak, Corvallis, OR (US)

(73) Assignee: Hewlett-Packard Development Coompany, L.P., Houston, TX (US)

( * ) Notice: Subject to any disclaimer, the term of this patent is extended or adjusted under 35 U.S.C. 154(b) by 0 days.

(21) Appl. No.: 10/976,452

(22) Filed: Oct. 29, 2004

(65) Prior Publication Data

US 2006/0094149 A1 May 4, 2006

(51) Int. Cl.
*H01L 21/00* (2006.01)
(52) U.S. Cl. ............... 438/48; 438/51; 438/113
(58) Field of Classification Search .......... 438/10–113
See application file for complete search history.

(56) References Cited

U.S. PATENT DOCUMENTS

| | | | |
|---|---|---|---|
| 6,303,986 B1 | 10/2001 | Shook | |
| 6,379,988 B1 | 4/2002 | Peterson et al. | |
| 6,384,473 B1 | 5/2002 | Peterson et al. | |
| 6,495,895 B1 | 12/2002 | Peterson et al. | |
| 6,531,767 B2 | 3/2003 | Shrauger | |
| 6,555,904 B1 | 4/2003 | Karpman | |
| 6,558,976 B2 | 5/2003 | Shrauger | |
| 6,635,509 B1 | 10/2003 | Ouellet | |
| 6,661,084 B1 | 12/2003 | Peterson et al. | |
| 6,674,159 B1 | 1/2004 | Peterson et al. | |
| 6,704,131 B2 | 3/2004 | Liu | |
| 6,806,993 B1 * | 10/2004 | Adams et al. ............. 359/291 |
| 6,884,650 B2 * | 4/2005 | Lee et al. ................ 438/51 |
| 6,969,630 B2 * | 11/2005 | Ozgur ..................... 438/53 |
| 2002/0056560 A1 | 5/2002 | Liu | |
| 2002/0105699 A1 | 8/2002 | Miracky et al. | |
| 2002/0115234 A1 * | 8/2002 | Siniaguine ............ 438/107 |
| 2002/0170175 A1 * | 11/2002 | Aigner et al. ........... 29/884 |
| 2003/0211654 A1 | 11/2003 | Kocian et al. | |
| 2004/0012083 A1 | 1/2004 | Farrell et al. | |
| 2004/0067604 A1 * | 4/2004 | Ouellet et al. .......... 438/108 |
| 2004/0219700 A1 * | 11/2004 | Silverbrook ............ 438/22 |
| 2004/0259325 A1 * | 12/2004 | Gan .................... 438/456 |
| 2005/0042802 A1 * | 2/2005 | Silverbrook ............ 438/106 |
| 2005/0095835 A1 * | 5/2005 | Humpston et al. ........ 438/613 |
| 2005/0176166 A1 * | 8/2005 | Chen et al. .............. 438/51 |
| 2005/0258516 A1 * | 11/2005 | Hong et al. ............ 257/659 |

* cited by examiner

*Primary Examiner*—Savitri Mulpuri

(57) ABSTRACT

This disclosure relates to lids and methods for forming and using them. One embodiment of these lids enables MEMS protected by the lids to be smaller. Another of these lids enables testing of a group of conjoined, lidded MEMS. Also, processes for forming and using these lids are also disclosed. One of these processes forms lids from a lid precursor residing over an assembly MEMS.

14 Claims, 5 Drawing Sheets

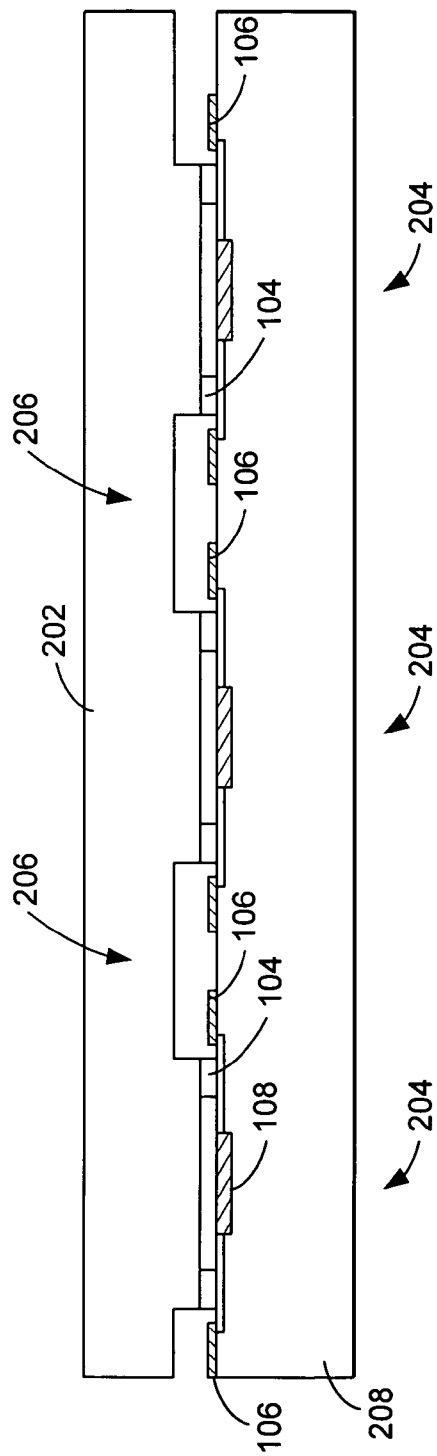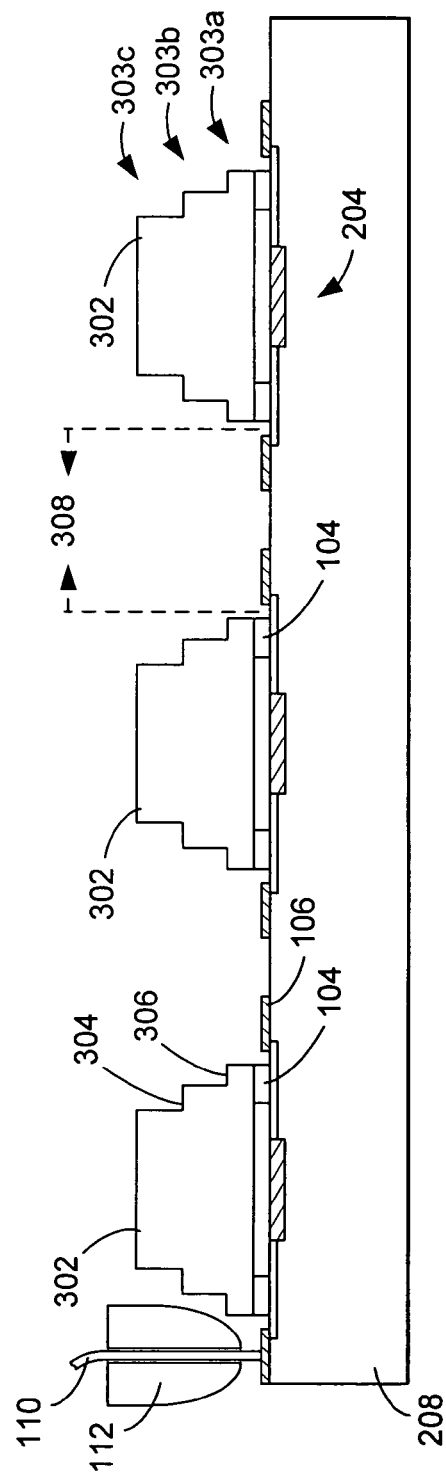

US 7,300,812 B2

MICRO ELECTRICAL MECHANICAL SYSTEM

TECHNICAL FIELD

This invention relates to micro electrical mechanical systems.

BACKGROUND

Some Micro Electrical Mechanical Systems ("MEMS") comprise devices that are protected with lids. These lids may protect the MEMS devices from physical damage or interference. They may also, in conjunction with a substrate, provide other mechanical, optical, radiative, or fluidic functions. These lids present various problems, however.

Referring to FIG. 1, a MEMS chip 100 with a lid 102 has a bond ring 104 and electrical contacts 106. The lid covers a protected device 108 of the MEMS. One of the problems with a lidded MEMS is that it is typically larger than a MEMS without a lid. This is partly because the electrical contacts are separated by a distance $D_1$ from the bond ring (and a corresponding distance from the protected device 108). This distance $D_1$ is usually needed in order to permit electrical communication with the electrical contacts, in this case with a wire 110 applied with a bonder tip 112.

To partially reduce the size of the lidded MEMS, smaller bonder tips have been used. These smaller bonder tips permit a reduction in this distance but may cause other problems. They are often less reliable, which can result in unusable MEMS when they fail to electrically connect the wire to the electrical contacts. Also, the smaller bonder tips are usually less durable because of their smaller size, and so have to be replaced more often.

Another problem with lidded MEMS is that they can be expensive to test. MEMS, lidded or not, are often formed in large groups on a single substrate 114. MEMS without lids are typically tested with a probe card using an e-testing or parametric testing machine. MEMS with lids are not typically tested with a probe card, however, because the lids interfere with the probe card. For this reason, most lidded MEMS are first separated into individual, stand-alone devices. Each is then tested. Testing each lidded MEMS individually, however, is typically more expensive than testing a group of non-lidded MEMS with a probe card.

BRIEF DESCRIPTION OF THE DRAWINGS

FIG. 2 includes a cross-sectional view of conjoined MEMS having an exemplary lid precursor.

FIG. 3 shows the view of FIG. 2 at a processing step subsequent to that shown by FIG. 2.

The same numbers are used throughout the disclosure and figures to reference like components and features.

DETAILED DESCRIPTION

Overview

Figure 1:
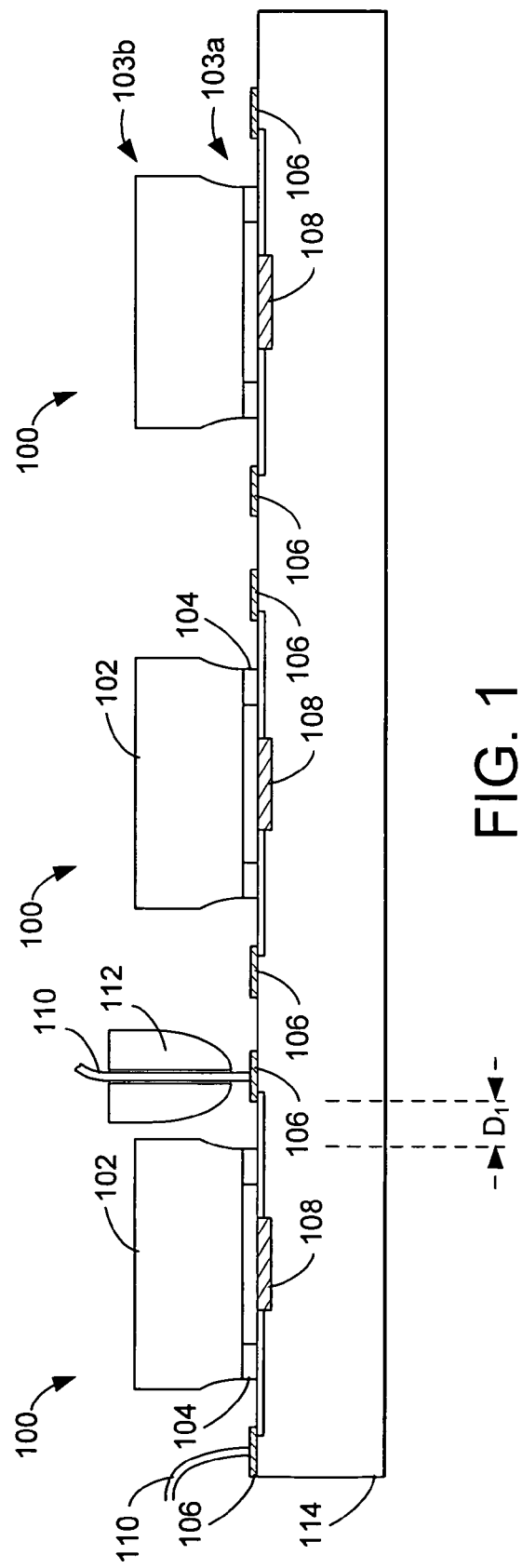
FIG. 1 is a cross-sectional view of prior-art lidded MEMS, and is discussed in the "Background" section above.

This document discloses lids and methods for forming and using them. One of these lids enables the MEMS it protects to be made smaller. Another of these lids allows an electrical contact of a MEMS to be positioned more closely to the lid or its bond ring. Still another lid is disclosed that enables a group of lidded MEMS to be tested while conjoined, such as when they are on a single substrate.

Processes for forming and using these lids are also disclosed. One of these processes forms lids from a lid precursor residing over an assembly of MEMS. Another of these processes forms a lid and then bonds it to a MEMS.

Forming Lids From a Precursor Residing Over the MEMS

Referring initially to FIG. 2, a lid precursor 202 is formed over multiple MEMS chips 204. The precursor comprises materials suitable for protecting the MEMS, such as glass, silicon, plastic, ceramic, and the like. The precursor can be formed with thin regions 206, shown in the illustrated embodiment. These thin regions reside over the electrical contacts 106 and can aid in processing the precursor into a lid. These MEMS chips comprise, in one embodiment, dimensions of about one to about 25 millimeters.

The precursor 202 can be formed over many MEMS chips 204 or just one. In the illustrated embodiment, the precursor is formed over three MEMS that are conjoined on a single substrate 208.

Referring to FIG. 3, one or more lids 302 are formed from the precursor. The lids 302 can be formed contemporaneously or one-at-a-time using a saw, photolithography and etching, laser, or other suitable technique. In embodiments where each lid is formed one at a time from one precursor, the precursor can comprise the prior-art lid 102 of FIG. 1, from which lid material can be removed to create the lid. This prior-art lid 102, when acting as a precursor, has a base region 103a and a top region 103b, the base region not being wider in dimension that the top region.

The lids 302 can be formed to have a set of regions 303. These regions 303 can include a base region 303a, a body region 303b, and a top region 303c, the body region 303b extending from the base region 303a to the top region 303c and/or residing between them. The base region is formed wider in dimension than the top region. These regions and this dimensional difference between the base region and the top region has an associated profile. The profile can be formed to have, for instance, a stepped, multi-stepped, curved (concave or convex), inwardly tapered (away from the MEMS), or obtusely angled cross section.

In one embodiment, the profile is formed accommodating dimensions, which may be pre-determined, of a particular contacting device intended to be contacted with the electrical contacts 106. If the bonder tip 112, for example, has a particular size and curvature that may not permit it to be placed as near as desired to the protected device 108 or the bond ring 104, this size and curvature can be determined and the lid's profile may be formed to accommodate this size and curvature. By so doing, the lid may be formed to permit the bonder tip 112 (and thus the electrical contacts 106) to be placed more closely to the bond ring 104 or the protected device 108.

In the illustrated embodiment, the profile of the lids is multi-stepped and formed with a saw. The blade of the saw can be lowered to a shallow depth, cutting the precursor to form a shallow step 304 of the lid. Following this, the blade can be lowered to a deeper depth, cutting the precursor to form a deep step 306 of the lid. If the precursor comprises the narrow region 206, as shown in this illustrated embodiment, the sawing process can be complete, as the deeper cut separates the precursor into individual lids separated by a gap 308. If the precursor does not have the narrow region or something similar, the saw blade can be lowered again, cutting the precursor to separate the precursor into individual lids 302 also having the gap.

Forming Lids Prior to Bonding Over MEMS

Figure 4:
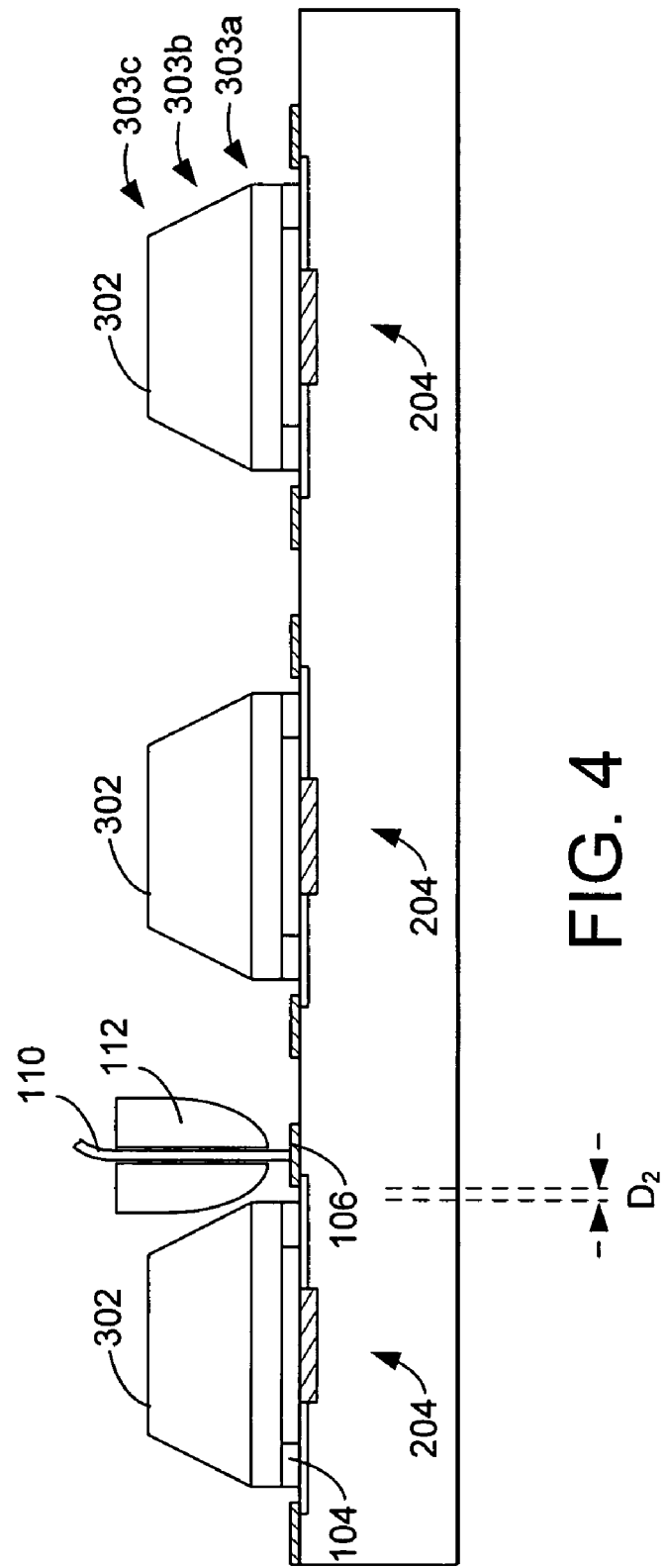
FIG. 4 shows a cross-sectional view of three exemplary conjoined MEMS having exemplary lids.

Referring to FIG. 4 the lids 302 are formed by molding, cutting, a laser, photolithography and etching, or another suitable technique. The lids illustrated in FIG. 4 may comprise injection molded plastic with an inwardly tapered cross section and the base region 303a, the body region 303b, and the top region 303c. Other profiles, such as those specifically formed to accommodate pre-determined dimensions of a probe or bonder tip, may also be used.

The lids are bonded, singularly or in multiples, over the MEMS chips 204, in this case using the bond rings 104. Each lid can be bonded over a singular, separate MEMS or over a MEMS that is part of a conjoined group (as illustrated). In embodiments with multiple MEMS, multiple lids can be bonded over multiple MEMS at once. The width of the lid at the base region 303a and/or outer dimensions of the bond ring can be equal to or somewhat smaller than the MEMS chip. The illustrated lid is designed to hermetically seal the MEMS's protected device 108 to isolate it from reactive gases.

Bonding to the Electrical Contacts

Referring again to FIG. 4, a conductive structure, such as the wire 110, is placed in electrical communication with the electrical contacts 106 of the MEMS chip 204. The lid 302 enables the MEMS chip to be formed smaller and/or with a smaller distance between the electrical contacts 106 and the lid 302 or the bond ring 104. The MEMS chip 100 of FIG. 1 has the original distance $D_1$. In contrast, an exemplary reduced distance $D_2$ enabled by the lid 302 is shown in FIG. 4.

In the embodiment illustrated in FIG. 4, the profile of the lid enables a reduction in the distance $D_1$ to the reduced distance $D_2$ while permitting the same mechanical contacting device to contact the electrical contacts 106, here the wire bonder tip 112. By so doing, or simply by allowing the mechanical contact device closer to the lid than it could be oriented to the prior-art lid 102, the lid 302 enables the MEMS to be made smaller. How much smaller $D_2$ is than $D_1$ may be dependent in part on the dimensions of the contacting device, (e.g., the bonder tip 112). Based on pre-determined dimensions of the contacting device, the profile of the lid may be adjusted to accommodate the contacting device based on these dimensions.

As shown in FIG. 4, for a small MEMS chip 204 and the wire bonder tip 112, the distance is reduced by more than about one half. This reduction can enable the MEMS to be significantly smaller, especially if the MEMS is small itself. In some cases, for instance, the distances $D_1$ on sides of the MEMS comprise a majority of a width of the MEMS chip 100. In these cases, reducing each $D_1$ by one half is effective to reduce the width and/or size of the MEMS by twenty-five or more percent. This reduction in the size of the MEMS permits them to be produced at lower cost and, in some cases, with better electrical characteristics enabled by the reduced distance, such as reduced parasitic impedance and/or capacitance.

Figure 5:
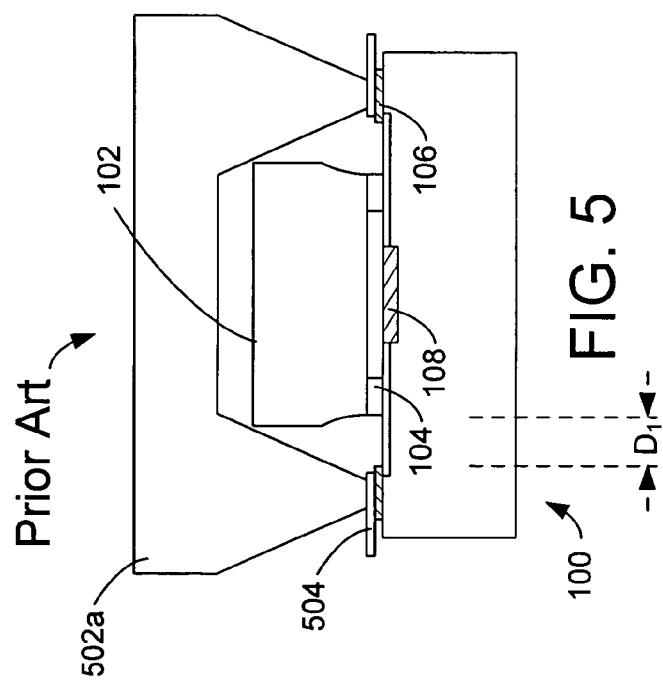
FIG. 5 shows a tab bonder and a cross-sectional view of a prior-art lidded MEMS.

Referring to FIG. 5, a tab bonder 502a is used to bond a tape automated bonding (TAB) lead 504 to the electrical contacts 106. FIG. 5 is illustrated to show the distance $D_1$ used with the prior-art lid 102 that will be TAB bonded.

Figure 6:
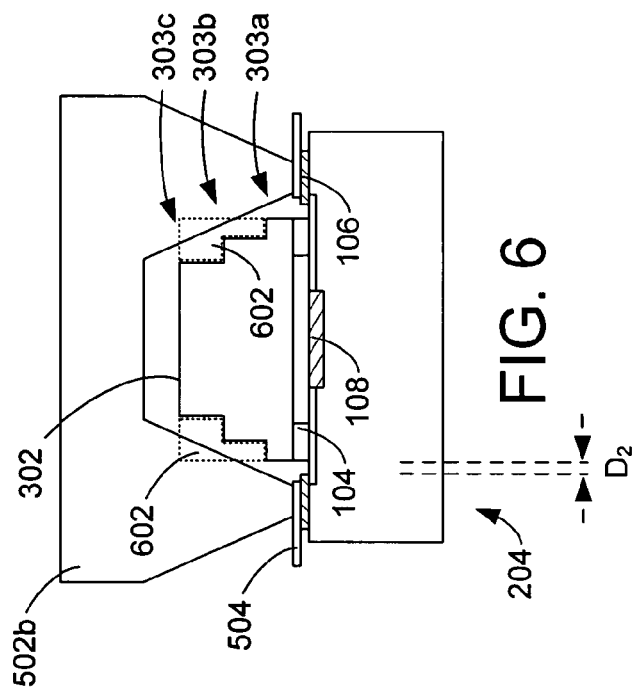
FIG. 6 shows a tab bonder and a cross-sectional view of a MEMS having an exemplary lid.

Referring to FIG. 6, a tab bonder 502b is used to bond a TAB lead 504 to the electrical contacts of the MEMS chip 204 having the lid 302. The tab bonders 502a and 502b differ in that 502b is not as wide as 502a. The lid permits tab bonders to touch the electrical contacts at a distance closer to the lid and/or the bond ring 104. This, in turn, permits the MEMS chip to be smaller. The distance $D_2$ enabled by the lid is shown in contrast with the larger distance $D_1$ of FIG. 5.

In some embodiments, the profile of the lid 302 permits a mechanical contact device (such as the tab bonder) to occupy a space 602 within which lid material would reside if the lid did not have its base region 303a being wider in dimension that its top region 303c. This space may permit the tab bonder or other device to be placed in close proximity to the base region 303a, the protected device 108, and/or bond ring 104 of the lid.

Testing Conjoined, Lidded MEMS

Figure 7:
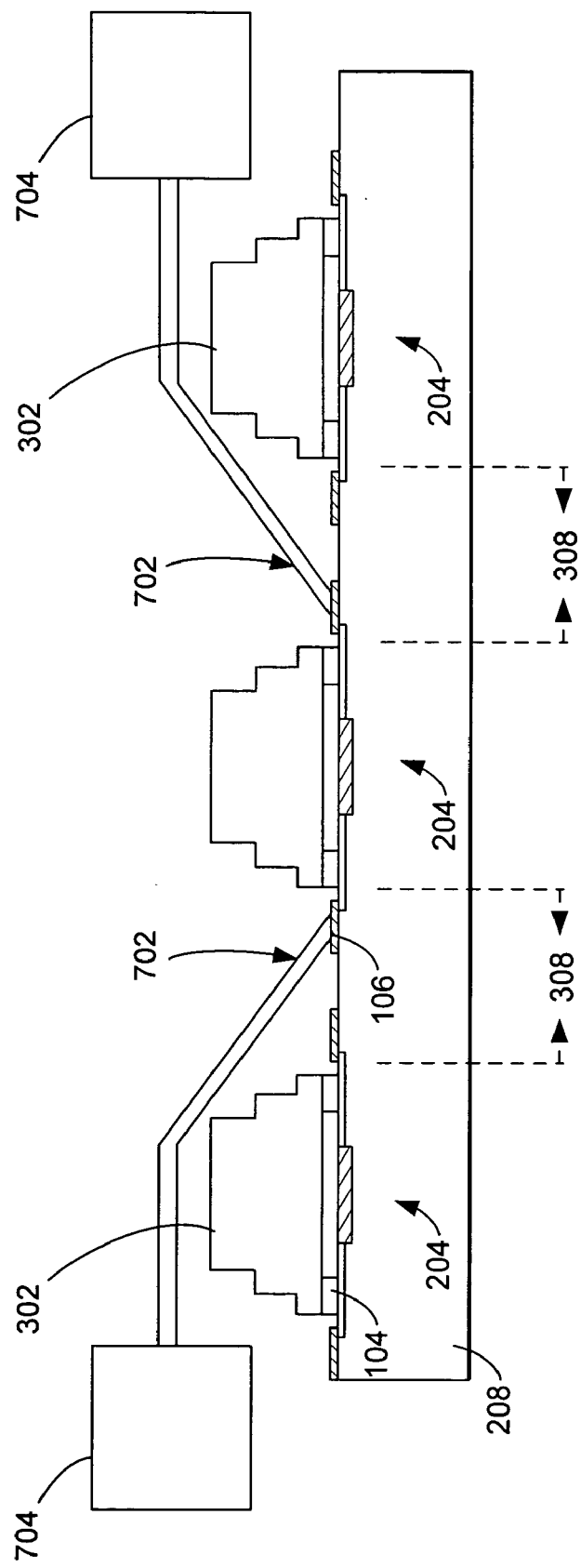
FIG. 7 includes electrical testing probes and a cross-sectional view of three exemplary conjoined MEMS having exemplary lids.

Referring to FIG. 7, conjoined, lidded MEMS chips 204 are tested. The lids 302 permit these MEMS to be tested as a group or singularly.

In the illustrated embodiment, a conjoined, lidded MEMS chip 204 is tested individually. In this embodiment, the lids 302 enable testing probes 702 to be inserted in gaps 308 to contact the electrical contacts 106. The lid permits larger, more stable, and/or less expensive probes to be used to test a conjoined, lidded MEMS, either individually or jointly. The lid may also enable probes to be inserted in the gap that the prior-art lid 102 does not permit, thereby allowing the MEMS to be tested when still conjoined. The testing probes are part of a probe card 704. The probe card can be used by e-testing or parametric machines. Other testing devices having probes can also be used, such as those designed for testing fluidic, biological, mechanical, transceiving, or sensing functionalities of a MEMS. Probe card 704 can contain multiple testing probes, permitting multiple, conjoined MEMS to be tested at once.

In another embodiment, multiple conjoined MEMS are tested contemporaneously. FIG. 7 shows a cross-section of one MEMS chip being tested, though other MEMS chips perpendicular to plane of the cross section can also be tested, such as with one probe card having multiple sets of testing probes.

In still another embodiment, lidded MEMS chip 204 is tested when not conjoined. In this embodiment (not shown) a testing device can temporarily touch the electrical contacts to test attributes of the lidded MEMS. The lid 302 enables testing probes to be inserted generally perpendicular to the MEMS surface. Inserting them generally perpendicular can be less expensive than inserting them at substantial angles to avoid a prior-art lid, such as the prior-art lid 102.

Although the invention is described in language specific to structural features and methodological steps, it is to be understood that the invention defined in the appended claims is not necessarily limited to the specific features or steps described. Rather, the specific features and steps disclosed represent exemplary forms of implementing the claimed invention.

What is claimed is:

1. A method comprising:
   providing a Micro Electrical Mechanical System (MEMS) having a lid and an electrical contact residing outside the lid, the lid having a base region, a body region, and a top region, the body region extending from the base region to the top region, the base region being wider in dimension than the top region wherein the lid is formed with a stepped profile; and contacting the contact effective to enable electrical communication with the MEMS, wherein the act of contacting comprises orienting a mechanical contact device within a space in which lid material would reside if the lid did not have the base region being wider in dimension than the top region, and wherein the act of contacting comprises bonding a conductive structure to the electrical contact with the mechanical contact device, and wherein the act of contacting is effective to enable testing of the MEMs.

2. The method of claim 1, wherein the act of providing comprises:

providing an assembly of conjoined MEMS each having a lid and an electrical contact residing outside the lid, each lid having a base region, a body region, and a top region, each body region extending from each base region to each top region, each base region being wider in dimension than each top region; and wherein the act of contacting comprises:

contacting the electrical contacts of the conjoined MEMS effective to enable electrical communication with at least one of the conjoined MEMS.

3. The method of claim 2, wherein the act of contacting the electrical contacts of the conjoined MEMS comprises orienting a mechanical contact device within spaces in which lid material would reside if each of the lids did not have each base region being wider in dimension that each top region.

4. The method of claim 2, wherein the act of contacting the electrical contacts of the conjoined MEMS is effective to test each of the conjoined MEMS.

5. A method comprising:

providing a lid precursor oriented over a Micro Electrical Mechanical System (MEMS), wherein the lid precursor comprises a structure having a base region and a top region, the base region not being wider in dimension than the top region;

removing material from the precursor effective to form over the MEMS a lid having a base region, a body region, and a top region, the body region extending from the base region to the top region, the base region being wider in dimension than the top region, wherein the lid is formed with a stepped profile, wherein the MEMS comprises an electrical contact residing outside the lid; and contacting the electrical contact effective to enable electrical communication with the MEMS, wherein the act of contacting comprises orienting a mechanical contact device within a space in which lid material would reside if the lid did not have the base region being wider in dimension than the top region, and wherein the act of contacting comprises bonding a conductive structure to the electrical contact with the mechanical contact device.

6. A method comprising:

providing a lid precursor oriented over an assembly of Micro Electrical Mechanical Systems (MEMS);

forming, over the MEMS, lids from the lid precursor, each of the lids having a base region, a body region, and a top region, the body region extending from the base region to the top region, the base region being wider in dimension than the top region, wherein the act of forming comprises forming the lids with an obtusely angled profile relative to a surface plane of a substrate over which the assembly of MEMS is oriented, and wherein each MEMS of the assembly comprises an electrical contact residing outside its lid; and contacting the electrical contacts effective to enable electrical communication with each MEMS of the assembly, wherein the act of contacting the electrical contacts comprises orienting a mechanical contact device within spaces in which lid material would reside if at least one of the lids did not have its base region being wider in dimension that its top region, and wherein the act of contacting comprises bonding a conductive structure to the electrical contact with the mechanical contact device.

7. The method of claim 6, wherein the act of providing comprises providing the lid precursor with thin regions over electrical contacts of the MEMS.

8. The method of claim 6, wherein the assembly is on a single substrate.

9. The method of claim 6, wherein the act of forming comprises forming the lids using a saw.

10. The method of claim 6, wherein the act of forming comprises forming the lids with a stepped profile.

11. The method of claim 6, wherein the act of forming comprises contemporaneously forming the lids of the assembly.

12. The method of claim 11, wherein the act of contemporaneously forming the lids of the assembly comprises photolithography and etching.

13. The method of claim 6, wherein the act of contacting the electrical contacts is performed contemporaneously for multiple MEMS of the assembly.

14. A method comprising:

providing a first lid having a base region, a body region, and a top region, the body region extending from the base region to the top region, the base region being wider in dimension than the top region;

providing a second lid having a base region, a body region, and a top region, the second lid's body region extending from the second lid's base region to the second lid's top region, the second lid's base region being wider in dimension than the second lid's top region;

bonding the first lid over a first Micro Electrical Mechanical System (MEMS) effective to orient the base region in closer proximity to the first MEMS than the body region or the top region;

bonding the second lid over a second MEMS conjoined with the first MEMS;

wherein the first MEMS comprises an electrical contact residing outside the first lid; and contacting the electrical contact effective to enable electrical communication with the first MEMS, and wherein the act of contacting comprises orienting a mechanical contact device within a space in which first lid material would reside if the first lid did not have the base region being wider in dimension than the top region, wherein the first and second lids enable testing probes to contact the electrical contacts;

wherein the first lid and the second lid are formed with a stepped profile.

* * * * *

UNITED STATES PATENT AND TRADEMARK OFFICE
CERTIFICATE OF CORRECTION

| | |
|---|---|
| PATENT NO. | : 7,300,812 B2 |
| APPLICATION NO. | : 10/976452 |
| DATED | : November 27, 2007 |
| INVENTOR(S) | : Chien-Hua Chen et al. |

It is certified that error appears in the above-identified patent and that said Letters Patent is hereby corrected as shown below:

On the title page, in field (73), in "Assignee", line 2, delete "Coompany" and insert -- Company --, therefor.

In column 5, line 13, in Claim 1, delete "MEMs" and insert -- MEMS --, therefor.

Signed and Sealed this

Eleventh Day of November, 2008

JON W. DUDAS
*Director of the United States Patent and Trademark Office*